United States Patent
Floman et al.

(10) Patent No.: US 7,280,054 B2
(45) Date of Patent: Oct. 9, 2007

(54) INTEGRATED CIRCUIT INTERFACE THAT ENCODES INFORMATION USING AT LEAST ONE INPUT SIGNAL SAMPLED AT TWO CONSECUTIVE EDGE TRANSITIONS OF A CLOCK SIGNAL

(75) Inventors: Matti Floman, Kangasala (FI); Jani Klint, Tampere (FI)

(73) Assignee: Nokia Corporation, Espoo (FI)

( * ) Notice: Subject to any disclaimer, the term of this patent is extended or adjusted under 35 U.S.C. 154(b) by 26 days.

(21) Appl. No.: 11/003,585

(22) Filed: Dec. 2, 2004

(65) Prior Publication Data

US 2006/0132337 A1    Jun. 22, 2006

(51) Int. Cl.
*H03M 5/08* (2006.01)
(52) U.S. Cl. .................................. 341/53; 341/64
(58) Field of Classification Search ............... 365/222, 365/230.03; 341/53, 64
See application file for complete search history.

(56) References Cited

U.S. PATENT DOCUMENTS

| | | | | |
|---|---|---|---|---|
| 6,069,573 A | * | 5/2000 | Clark et al. .................. 341/50 |
| 6,185,150 B1 | * | 2/2001 | Toda et al. ................. 365/233 |
| 6,445,632 B2 | * | 9/2002 | Sakamoto .................... 365/205 |
| 6,476,932 B1 | * | 11/2002 | Moizio et al. ............... 358/1.2 |
| 6,690,309 B1 | * | 2/2004 | James et al. ................. 341/102 |
| 6,816,095 B1 | * | 11/2004 | Yokoyama et al. ......... 341/101 |
| 6,894,946 B2 | * | 5/2005 | Jang .......................... 365/233 |
| 2001/0040829 A1 | * | 11/2001 | Arimoto et al. ....... 365/189.02 |
| 2003/0198119 A1 | * | 10/2003 | Jones et al. ............ 365/230.03 |
| 2004/0022088 A1 | * | 2/2004 | Schaefer ................ 365/189.07 |
| 2004/0085825 A1 | * | 5/2004 | Narita et al. ................. 365/200 |
| 2004/0120210 A1 | * | 6/2004 | Lee ............................. 365/232 |
| 2005/0024984 A1 | * | 2/2005 | Lee et al. .................... 365/233 |
| 2005/0281128 A1 | * | 12/2005 | Dortu ......................... 365/233 |
| 2006/0044879 A1 | * | 3/2006 | Yamaguchi et al. ... 365/189.05 |

* cited by examiner

*Primary Examiner*—Linh V. Nguyen
(74) *Attorney, Agent, or Firm*—Harrington & Smith, PC

(57) ABSTRACT

An integrated circuit, such as a dynamic RAM, includes a plurality of terminals for coupling to signal lines. One of the signal lines is an input signal line that conveys a clock signal, and at least one other signal line is also an input signal line that conveys information that is encoded by a level of the at least one other signal line at n consecutive edge transitions of the clock signal, where n≧2.

53 Claims, 3 Drawing Sheets

| COMMAND (FOR AN EXAMPLE) | RISING EDGE | | FALLING EDGE | |
|---|---|---|---|---|
| | CMD0 | CMD1 | CMD0 | CMD1 |
| PRECHARGE POWER DOWN EXIT & ACTIVE POWER DOWN EXIT & SELF REFRESH EXIT | 0 | 0 | 0 | 0 |
| AUTO REFRESH | 0 | 0 | 0 | 1 |
| SELF REFRESH ENTRY | 0 | 0 | 1 | 0 |
| BANK ACTIVE&ROW ADDR | 0 | 1 | 1 | 1 |
| READ&COLUM ADD: AUTO PRECHARGE DESABLE | 0 | 1 | 0 | 0 |
| READ&COLUM ADD: AUTO PRECHARGE ENABLE | 0 | 1 | 0 | 1 |
| WRITE&COLUM ADD: AUTO PRECHARGE DESABLE | 0 | 0 | 1 | 0 |
| WRITE&COLUM ADD: AUTO PRECHARGE ENABLE | 0 | 1 | 1 | 1 |
| BURST STOP | 1 | 0 | 0 | 0 |
| PRECHARGE | 1 | 0 | 0 | 1 |
| ACTIVE POWER DOWN ENTRY | 1 | 0 | 1 | 0 |
| PRECHARGE POWER DOWN MODE ENTRY | 1 | 0 | 1 | 1 |
| MRS | 1 | 1 | 0 | 0 |
| RFU | 1 | 1 | 0 | 1 |
| RFU | 1 | 1 | 1 | 0 |
| NOP | 1 | 1 | 1 | 1 |

FIG.4

INTEGRATED CIRCUIT INTERFACE THAT ENCODES INFORMATION USING AT LEAST ONE INPUT SIGNAL SAMPLED AT TWO CONSECUTIVE EDGE TRANSITIONS OF A CLOCK SIGNAL

TECHNICAL FIELD

The presently preferred embodiments of this invention relate generally to memory and other devices found in circuit packages and modules and, more specifically, relate to methods and apparatus for interfacing an integrated circuit to other circuitry while attempting to minimize complexity and a number of required integrated circuit input/output connections or pins.

BACKGROUND

The pin count of integrated circuits is an important consideration, as it affects at least the package size, interface complexity and printed wiring board (PWB) trace density and routing. However, increasing pin counts are beginning to present a problem, such as in modern complex ASICs that can contain a number of functions, including memory functions.

These pin count-related problems can be especially troublesome in small, low cost consumer products, such as wireless communication terminals, gaming devices, digital cameras, lap top computers and the like.

SUMMARY OF THE PREFERRED EMBODIMENTS

The foregoing and other problems are overcome, and other advantages are realized, in accordance with the presently preferred embodiments of this invention.

In one aspect thereof this invention provides a circuit that includes a plurality of terminals for coupling to signal lines, where one of the signal lines is an input signal line that conveys a clock signal, and where at least one other signal line is also an input signal line that conveys information that is encoded by a level of the at least one other signal line at n consecutive edge transitions of the clock signal, where $n \geq 2$.

In another aspect thereof this invention provides a method to input information to a circuit via a plurality of terminals coupled to signal lines. The method includes applying a clock signal to one signal line and encoding information on at least one other signal line by setting a level of the at least one other signal line so as to be in a predetermined state at each of n consecutive edge transitions of the clock signal, where $n \geq 2$.

In at least one further aspect thereof this invention provides a method to receive information at an integrated circuit. The method includes receiving a clock signal, sampling the state of a signal appearing on at least one integrated circuit terminal at each of n consecutive edge transitions of the received clock signal, where $n \geq 2$, and correlating the sampled states with information encoded by the at least one signal.

In a still further aspect thereof this invention provides a device comprising at least one circuit package that comprises a plurality of terminals for coupling to signal lines. One of the signal lines is an input signal line that conveys a clock signal, and at least one other signal line is also an input signal line that conveys information that is encoded by a level of the at least one other signal line at n consecutive edge transitions of the clock signal, where $n \geq 2$. The device may be, or may comprise, a communications terminal, such as a cellular telephone.

In a still further aspect thereof this invention provides a method to operate a memory unit, and a memory unit that operates in accordance with the method, that includes applying a clock signal to one memory unit input signal line and encoding information on at least one other memory unit input signal line by setting a level of the at least one other memory unit input signal line so as to be in a predetermined state at each of n consecutive edge transitions of the clock signal, where $n \geq 2$, and where the predetermined state is one selected to wake up the memory unit from a power down mode. In a presently preferred, but non-limiting embodiment, the operations of applying and encoding operate without the use of a clock enable (CKE) signal input to the memory unit.

BRIEF DESCRIPTION OF THE DRAWINGS

The foregoing and other aspects of the presently preferred embodiments of this invention are made more evident in the following Detailed Description of the Preferred Embodiments, when read in conjunction with the attached Drawing Figures, wherein:

FIG. 4 illustrates non-limiting examples of a plurality of memory unit commands and the states of the command signal lines for both rising and falling clock signal edges.

DETAILED DESCRIPTION OF THE PREFERRED EMBODIMENTS

By way of introduction, the embodiments of this invention reduce a number of IC pins needed for connecting an integrated circuit, such as a memory integrated circuit, such as a dynamic RAM (DRAM), to other circuitry, such as baseband circuitry in a portable wireless communications terminal. The embodiments of this invention provide a novel technique for interpreting a control or command sequence based on multiple clock edge transitions. The use of bank addressing, as well as multi-voltage level (multi-level) bus technology can also be employed.

Figure 1:
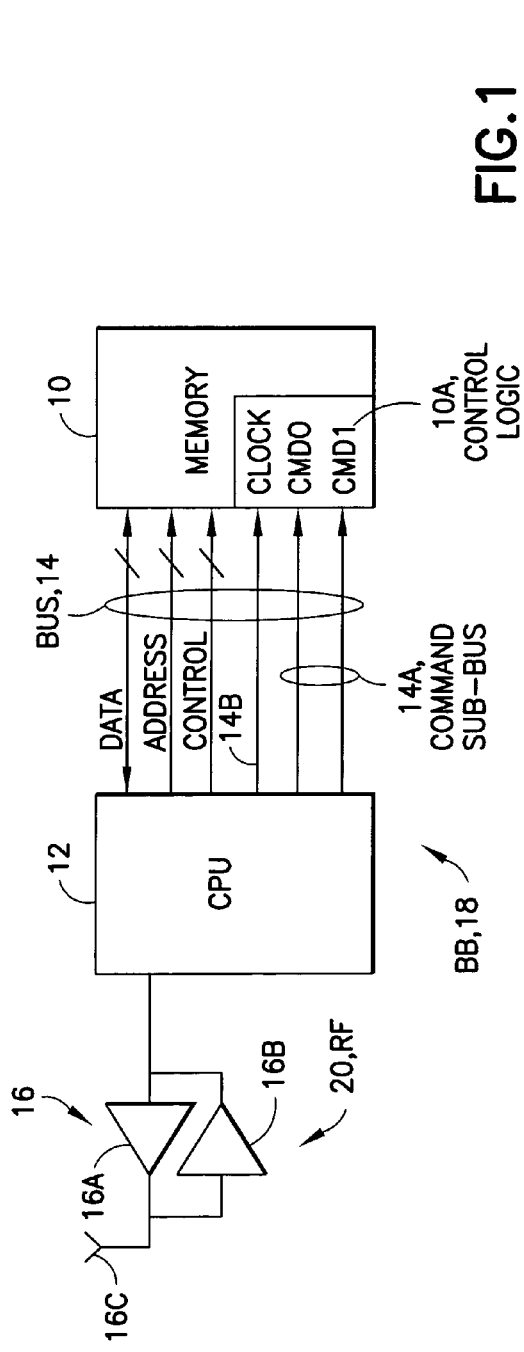
FIG. 1 is a simplified block diagram of a central processing unit (CPU) coupled to memory unit through a bus, where the bus includes a plurality of command signal lines and an associated clock signal line for conveying memory unit control signals and a clock signal, respectively.

FIG. 1 is a simplified block diagram of a memory unit 10 coupled to a central processing unit (CPU) 12 through a bus 14. In addition to conventional bidirectional data signal lines, address signal lines, and control signal lines (such as a read/write signal line), the bus includes a command sub-bus 14A and a clock signal line 14B. For the case where the memory unit 10 is located in an IC separate from the CPU 12, each of the bus 14 signal lines needs to be connected to the memory unit 10 via an IC pin or terminal.

In other embodiments the memory unit 10 and the CPU 12 may be integrated on, or otherwise combined within, the same IC package. However, in this case the bus 14 still interfaces to the memory unit 10.

Note that certain of the signals lines could be placed in an optional control bus.

In the preferred, but non-limiting embodiments of this invention there are three buses. These are the control, address and data (includes data strobes) buses shown in FIG. 1. Clock signal(s) are not typically referred to as a bus. In traditional memories there is a single clock signal, but in more advanced memories a differential clock is used, which requires two signal lines.

For a case where memory unit 10 and CPU 12 form a part of a communications terminal, such as a cellular telephone, there may also be a wireless section, such as a radio frequency (RF) transceiver 16 having an RF transmitter 16A and an RF receiver 16B for coupling to at least one antenna 16C. In this case the memory 10 and the CPU 12 may be considered to form a part of a baseband (BB) section 18 of the communications terminal, as opposed to an RF section 20. Note that in this embodiment the CPU 12 may be, or may be coupled to, a digital signal processor (DSP) or equivalent high speed processing logic.

In general, the various embodiments of a device wherein the circuit constructed and operated in accordance with this invention can be located include, but are not limited to, cellular telephones, personal digital assistants (PDAs) having or not having wireless communication capabilities, portable computers having or not having wireless communication capabilities, image capture devices such as digital cameras having or not having wireless communication capabilities, gaming devices having or not having wireless communication capabilities, music storage and playback appliances having or not having wireless communication capabilities, Internet appliances permitting wireless or wired Internet access and browsing, as well as portable units, terminals and devices that incorporate combinations of such functions.

Note in the embodiment of FIG. 1 that the command sub-bus 14A includes two signal lines, labeled CMD0 and CMD1. In other embodiments of this invention there may be more or less than two command signal lines.

Further, and in general, the circuit and method operate with n consecutive edge transitions of the clock signal, where n≧2.

Figure 2:
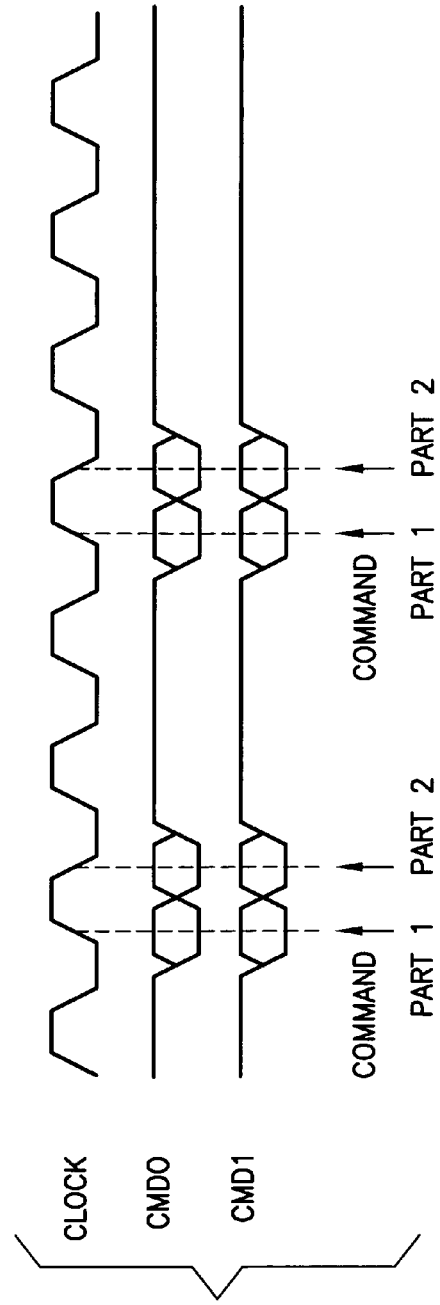
FIG. 2 is a waveform diagram that shows the relationship between clock signal edges and the command signals of FIG. 1.

In accordance with the embodiments of this invention, and referring to FIG. 2 in combination with FIG. 4, it can be seen that the state of each command sub-bus 14B signal line is sampled twice per clock pulse, once on the rising edge and once on the falling edge. The yields two signal line states per clock pulse, and an ability to encode up to 16 individual commands using two command signal lines in the command sub-bus 14A, as shown in FIG. 4.

Note that the clock edge sampling could be arranged so that the falling edge was used first to sample CMD0 and CMD1, followed by the next rising edge. In either case two consecutive clock edges are used to sample the state or level of at least one other signal line to determine the information that is encoded by the level(s) of the at least one other signal line.

Figure 3:
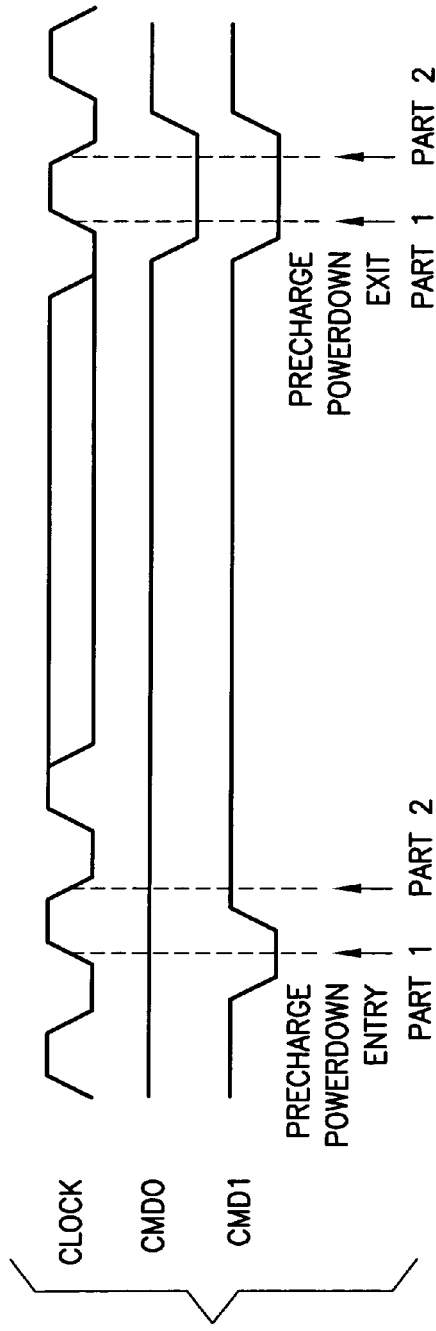
FIG. 3 is a waveform diagram that shows the relationship between clock signal edges and the command signals of FIG. 1 for an example of entering and exiting a memory unit precharge powerdown mode of operation.

FIG. 3 shows the example of entering and exiting a memory unit precharge powerdown mode of operation. Referring also to FIG. 4, the Precharge Powerdown Entry command is given by making CMD0 high ("1") and CMD1 low ("0") on the rising edge of the clock signal 14B, then leaving CMD0 high ("1") and making CMD1 high ("1") on the falling edge of the clock signal 14B. This sequence of four command signal line states (1011, as in FIG. 4) is interpreted by control logic 10A in the memory unit 10 as a receipt of the Precharge Powerdown Entry command. The corresponding Precharge Powerdown Exit command is given by making CMD0 low ("0") and CMD1 low ("0") on the rising edge of the clock signal 14B, then leaving both CMD0 and CMD1 low ("0") on the falling edge of the clock signal 14B. This sequence of four command signal line states (0000, as in FIG. 4) is interpreted by control logic 10A in the memory unit 10 as a receipt of the Precharge Powerdown Entry command. Note further that this same command is interpreted, if the memory unit is already in the Active Powerdown mode (previously received command (1010)), as an Active Powerdown Exit command, and that this same command (0000) is interpreted, if the memory unit is already in the Self Refresh mode (previously received command (0010)), as a Self Refresh Exit command. Thus, this one command (0000) can function as a plurality of Exit commands for a plurality of different memory unit 10 commands.

In a further embodiment a conventional clock enable (CKE) signal input to the memory unit 10 can be removed, and the memory unit 10 may be made to wake up from a power down mode by the transitions of the clock signal 14B edges, and at the same time making at least one command signal, such as CMD0 and CMD1 both one (shown as a NOP command in FIG. 4), and/or placing at least one, and possibly all address signal lines into a predetermined state (e.g., all ones).

A bank address may be issued at row and column address sequences. Further in this regard, note that a standard DRAM includes an address bus and signals for bank selection. Bank selection signals are used during an address sequence for indicating to the DRAM which one of two or more memory banks is the target for a row or column address. For the purposes of this invention any bank signal or signals may be considered to be part of the address bus, although in other embodiments they may be provided separately.

As a further embodiment, one of the address bus pins (e.g., A0) may be used for indicating a Precharge_All operation. Further in this regard, note that in a standard DRAM one address pin (e.g., A10) is used to indicate a Precharge_All command (all banks are precharged). This occurs when A10 is high and a Precharge command is issued. When A10 is low the Precharge command is interpreted as a normal Precharge command. With the (normal) Precharge command the bank to be precharged is indicated together with the bank address. In accordance with a non-limiting embodiment of this invention one of the address pins may used to indicate a Precharge_All command during a Precharge command operation sent on the command sub-bus 14A. Using an address signal (e.g., A0 or A10) is but one way to indicate a Precharge_All command, another way is to add a Precharge_All command to the list of exemplary commands shown in FIG. 4.

Figure 5:
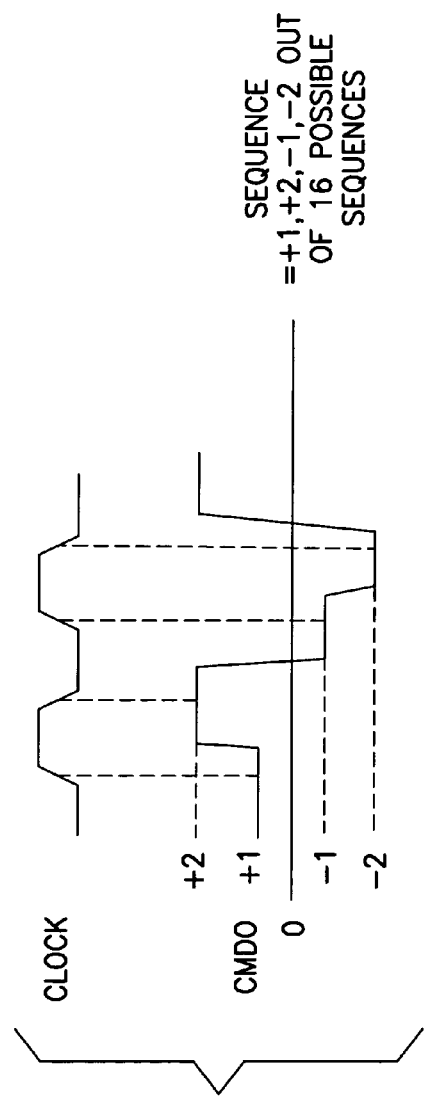
FIG. 5 shows a waveform diagram that depicts the relationship between clock signal edges and an exemplary multilevel command signal.

In a still further embodiment, the bus 14 can employ a multilevel mode, as shown in FIG. 5, where by example only CMD0 is shown as transitioning between four voltage levels indicated as +2, +1, −1, −2. In this non-limiting example, for one clock edge there are four discrete voltage levels possible for each command signal pin, thereby enabling even further information to be derived from the use of the rising and falling clock edges, and enabling even further reductions in the number of required IC pins to convey an equivalent amount of information. For example, the use of a single multilevel CMD0 signal line can convey at least the same amount of information to the memory unit 10 as the two command signal lines CMD0 and CMD1 shown in FIGS. 1–4. A multilevel signal line technique can be employed with the data signal lines and/or the address signal lines as well in order to further reduce the required number of signal lines.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other different, similar or equivalent commands as those shown in FIG. 4 may be attempted by those skilled in the art. Further, and while described above in the context of a dynamic RAM (DRAM), static RAMS and FLASH memories are also within the scope of these embodiments. Further, the teachings of this invention are not limited for use only with memory devices, as commands could be issued as well to input/output devices, such as peripheral memory control devices, disk controllers, serial communication devices and other types of devices. Further, more or less than four voltage levels could be used in the multilevel mode. Further, other than commands could be input to (or output from) a device. For example, status information, alarm information and/or other types of information could be conveyed using the teachings of this invention. However, all such and similar modifications of the teachings of this invention will still fall within the scope of the embodiments of this invention.

Furthermore, some of the features of the preferred embodiments of this invention may be used to advantage without the corresponding use of other features. As such, the foregoing description should be considered as merely illustrative of the principles, teachings and embodiments of this invention, and not in limitation thereof.

What is claimed is:

1. A circuit, comprising a plurality of terminals for coupling to signal lines, where one of the signal lines is an input signal line that conveys a clock signal, and where a plurality of other signal lines are also input signal lines that conveys information that is encoded by a level of each of the plurality of other signal lines when considered together and when sampled at n consecutive edge transitions of the clock signal, where n is greater than or equal to 2.

2. A circuit as in claim 1, where two consecutive edges comprise a rising edge followed by a falling edge.

3. A circuit as in claim 1, where each of the plurality of other signal lines is capable of assuming two discrete levels.

4. A circuit as in claim 1, where each of the plurality of other signal lines is capable of assuming more than two discrete levels.

5. A circuit as in claim 1, where the information comprises a plurality of commands.

6. A circuit as in claim 1, where said circuit comprises a memory unit, and where the information comprises a plurality of memory unit-related commands.

7. A circuit as in claim 1, where said circuit comprises part of a communications terminal.

8. A method to input information to a circuit via a plurality of terminals coupled to signal lines, comprising:
applying a clock signal to one signal line; and
encoding information on a plurality of other signal lines by setting a level of each of the plurality of other signal lines so as to be in a predetermined state when considered together and when sampled at each of n consecutive edge transitions of the clock signal, where n is greater than or equal to 2.

9. A method as in claim 8, where two consecutive edge transitions comprise a rising edge followed by a falling edge.

10. A method as in claim 8, where each of the plurality of other signal lines is capable of assuming two discrete levels.

11. A method as in claim 8, where each of the plurality of other signal lines is capable of assuming more than two discrete levels.

12. A method as in claim 8, where the information comprises a plurality of commands.

13. A method as in claim 8, where the circuit comprises a memory unit, and where the information comprises a plurality of memory unit-related commands.

14. A method to receive information at an integrated circuit, comprising:
receiving a clock signal;
receiving a signal from each of a plurality of other signal lines on a plurality of integrated circuit terminals, wherein each of the plurality of other signal lines conveys a signal comprising a corresponding state of a plurality of states and information that is encoded so as to be in a predetermined state when considered together and when sampled at each of n consecutive edge transitions of the clock signal, where n is greater than or equal to 2;
sampling the signal of each of the plurality of other signal lines on each of the plurality of integrated circuit terminals at each of the n consecutive edge transitions of the clock signal, where n is greater than or equal to 2; and
interpreting the information sampled on each of the plurality of integrated circuit terminals at each of the n consecutive edge transitions of the clock signal, where n is greater than or equal to 2.

15. A method as in claim 14, where two consecutive edge transitions comprise a rising edge followed by a falling edge.

16. A method as in claim 14, where each of the plurality of other signal lines is capable of assuming two discrete levels.

17. A method as in claim 14, where each of the plurality of other signal lines is capable of assuming more than two discrete levels.

18. A method as in claim 14, where the information comprises a plurality of commands.

19. A method as in claim 14, where the integrated circuit comprises a memory unit, and where the information comprises a plurality of memory unit-related commands.

20. A method as in claim 19, where at least one memory-unit related command comprises a Precharge command.

21. A method as in claim 19, where at least one memory-unit related command comprises a multi-bank Precharge command.

22. A method as in claim 19, where at least one memory-unit related command comprises a Precharge command, further comprising interpreting the state of at least one address signal in conjunction with the Precharge command to determine whether to Precharge one memory bank or more than one memory bank.

23. A device comprising at least one circuit package that comprises a plurality of terminals for coupling to signal lines, where one of the signal lines is an input signal line that conveys a clock signal, and where a plurality of other signal lines are also input signal lines that conveys information that is encoded by a level of each of the plurality of other signal lines when considered together and when sampled at n consecutive edge transitions of the clock signal, where n is greater than or equal to 2.

24. A device as in claim 23, where two consecutive edges comprise a rising edge followed by a falling edge.

25. A device as in claim 23, where each of the plurality of other signal lines are capable of assuming two discrete levels.

26. A device as in claim 23, where each of the plurality of other signal lines are capable of assuming more than two discrete levels.

27. A device as in claim 23, where the information comprises a plurality of commands.

28. A device as in claim 23, where said circuit package comprises a memory unit, and where the information comprises a plurality of memory unit-related commands.

29. A device as in claim 28, where at least one memory-unit related command comprises a multi-bank Precharge command.

30. A device as in claim 28, where at least one memory-unit related command comprises a Precharge command, further comprising a circuit to interpret the state of at least one address signal in conjunction with the Precharge command to determine whether to Precharge one memory bank or more than one memory bank.

31. A device as in claim 23, where said device comprises a communications terminal.

32. A method to operate a memory unit, comprising:
applying a clock signal to one memory unit input signal line; and
encoding information on at least one other memory unit input signal line by setting a level of the at least one other memory unit input signal line so as to be in a predetermined state at each of n consecutive edge transitions of the clock signal,
where n is greater than or equal to 2 where the predetermined state is one selected to wake up the memory unit from a power down mode.

33. A method as in claim 32, where applying and encoding operate without the use of a clock enable (CKE) signal input to the memory unit.

34. A method as in claim 32, where the at least one other memory unit input signal line comprises a command signal line.

35. A method as in claim 32, where the at least one other memory unit input signal line comprises two command signal lines.

36. A method as in claim 32, where the at least one other memory unit input signal line comprises at least one address signal line.

37. A method as in claim 32, where the at least one other memory unit input signal line comprises all address signal lines.

38. A memory unit, comprising:
a memory unit input signal line for coupling to a clock signal; and
at least one other memory unit input signal line for receiving encoded information by inputting a level on the at least one other memory unit input signal line so as to be in a predetermined state at each of n consecutive edge transitions of the clock signal, where n is greater than or equal to 2, and where the predetermined state is one selected to wake up the memory unit from a power down mode.

39. A memory unit as in claim 38, where the memory unit operates without the use of a clock enable (CKE) signal input to the memory unit.

40. A memory unit as in claim 38, where the at least one other memory unit input signal line comprises a command signal line.

41. A memory unit as in claim 38, where the at least one other memory unit input signal line comprises two command signal lines.

42. A memory unit as in claim 38, where the at least one other memory unit input signal line comprises at least one address signal line.

43. A memory unit as in claim 38, where the at least one other memory unit input signal line comprises all address signal lines.

44. A cellular telephone, comprising a memory circuit having a plurality of terminals for coupling to signal lines, where one of the signal lines is an input signal line that conveys a clock signal, and where a plurality of other signal lines are also input signal lines that conveys information that is encoded by a level of each of the plurality of other signal lines when considered together and when sampled at n consecutive edge transitions of the clock signal, where n is greater than or equal to 2.

45. A computer, comprising a memory circuit having a plurality of terminals for coupling to signal lines, where one of the signal lines is an input signal line that conveys a clock signal, and where a plurality of other signal lines are also input signal lines that conveys information that is encoded by a level of each of the plurality of other signal lines when considered together and when sampled at n consecutive edge transitions of the clock signal, where n is greater than or equal to 2.

46. A method to input information to an integrated circuit, comprising:
applying a clock signal to a first terminal of the integrated circuit; and
applying information to x second terminals of the integrated circuit, where x is greater than or equal to 1, where
the information applied to the x second terminals is sampled at y consecutive transitions of the clock signal, where y is greater than or equal to 2, and where the information is interpreted as z-bit data where z=x * y.

47. The method of claim 46, where x=1 and y=2.

48. The method of claim 46, where x=2 and y=2.

49. The method of claim 46, where the z-bit data is a command that is interpreted by the integrated circuit.

50. The method of claim 46, where the integrated circuit comprises a memory device, and where the z-bit data is memory device command.

51. A circuit, comprising:
a plurality of terminals for coupling to signal lines, where one of the signal lines is an input signal line that conveys a clock signal, and where a plurality of other signal lines are also input signal lines that convey information that is encoded by a level of each of the plurality of other signal lines when considered together and when sampled at n consecutive edge transitions of the clock signal, where n is greater than or equal to 2;
where the device further comprises a memory unit, and where the information comprises a plurality of memory unit-related commands.

52. A method, comprising:
applying a clock signal to one signal line of a circuit; and
encoding information on a plurality of other signal lines of the circuit by setting a level of each of the plurality of other signal lines so as to be in a predetermined state when considered together and when sampled at each of n consecutive edge transitions of the clock signal, where n is greater than or equal to 2; where the circuit comprises a memory unit, and where the information comprises a plurality of memory unit-related commands.

53. A method, comprising:

receiving a clock signal;

receiving a signal from each of a plurality of signal lines on a plurality of integrated circuit terminals of an integrated circuit, wherein each of the plurality of signal lines conveys a signal comprising a corresponding state of a plurality of states and information that is encoded so as to be in a predetermined state when considered together and when sampled at each of n consecutive edge transitions of the clock signal, where n is greater than or equal to 2;

sampling the signal of each of the plurality of signal lines on each of the plurality of integrated circuit terminals at each of the n consecutive edge transitions of the clock signal; and interpreting the information sampled on each of the plurality of integrated circuit terminals at each of the n consecutive edge transitions of the clock signal;

where the integrated circuit comprises a memory unit, and where the information comprises a plurality of memory unit-related commands.

* * * * *

UNITED STATES PATENT AND TRADEMARK OFFICE
CERTIFICATE OF CORRECTION

PATENT NO. : 7,280,054 B2  Page 1 of 1
APPLICATION NO. : 11/003585
DATED : October 9, 2007
INVENTOR(S) : Floman et al.

It is certified that error appears in the above-identified patent and that said Letters Patent is hereby corrected as shown below:

In the Claims:

Claim 51, Column 8, Line 60, delete "the device" and replace with --the circuit--.

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,280,054 B2  Page 1 of 1
APPLICATION NO. : 11/003585
DATED : October 9, 2007
INVENTOR(S) : Floman et al.

It is certified that error appears in the above-identified patent and that said Letters Patent is hereby corrected as shown below:

In the Claims:

Claim 1, Column 5, line 45, delete "conveys" and replace with --convey--.

Claim 23, Column 6, line 66, delete "conveys" and replace with --convey--.

Claim 44, Column 8, line 17, delete "conveys" and replace with --convey--.

Claim 45, Column 8, line 26, delete "conveys" and replace with --convey--.

Signed and Sealed this

First Day of July, 2008

JON W. DUDAS
*Director of the United States Patent and Trademark Office*